United States Patent [19]

Mizuno

[11] Patent Number: 5,119,152
[45] Date of Patent: Jun. 2, 1992

[54] MOS SEMICONDUCTOR DEVICE HAVING LDD STRUCTURE

[75] Inventor: Tomohisa Mizuno, Yokohama, Japan

[73] Assignee: Kabushiki Kaisha Toshiba, Kawasaki, Japan

[21] Appl. No.: 672,015

[22] Filed: Mar. 19, 1991

[30] Foreign Application Priority Data

Mar. 19, 1990 [JP] Japan ..................... 2-68636

[51] Int. Cl.⁵ ............... H01L 29/10; H01L 29/78
[52] U.S. Cl. ................... 357/23.3; 357/23.4; 357/54
[58] Field of Search ............ 357/23.3, 23.4, 54

[56] References Cited

U.S. PATENT DOCUMENTS

| | | | |
|---|---|---|---|
| 4,908,326 | 3/1990 | Ma et al. | 357/23.3 |
| 4,949,136 | 8/1990 | Jain | 357/23.3 |
| 4,951,100 | 8/1990 | Parrillo | 357/23.3 |
| 4,994,404 | 2/1991 | Sheng et al. | 357/23.3 |
| 5,023,190 | 6/1991 | Lee et al. | 357/23.3 |

OTHER PUBLICATIONS

"High Dielectric LDD Spacer Technology For High Performance MOSFET Using Gate-Fringing Field Effects", IEDM Technical Digest, pp. 613-616 (1989), T. Mizuno et al.

Primary Examiner—Andrew J. James
Assistant Examiner—Sara W. Crane
Attorney, Agent, or Firm—Banner, Birch, McKie & Beckett

[57] ABSTRACT

Disclosed is a MOS type semiconductor device, particularly, a MOS type transistor of an LDD structure, which is featured in the side wall structure which covers the side surface of a gate electrode formed on the surface of a semiconductor substrate with a first insulating film interposed therebetween. The semiconductor device comprises source and drain regions of a double diffusion structure consisting of an impurity diffusion region of a relatively low impurity concentration formed apart from the gate electrode in the surface region of the semiconductor substrate and positioned below the side wall region of the gate electrode, and an impurity diffusion region of a relatively high impurity concentration formed in the surface region of the semiconductor substrate and positioned outside the gate electrode. The side wall structure of the gate electrode comprises a first material layer having a first dielectric constant and formed as a side wall of the gate electrode on the impurity diffusion region of the relatively low impurity concentration, and a second material layer having a second dielectric constant small than the first dielectric constant and formed as a side wall of the gate electrode to cover the first material layer, said second material layer being positioned to cover the boundary region between the impurity diffusion regions of the low and high impurity concentrations.

16 Claims, 4 Drawing Sheets

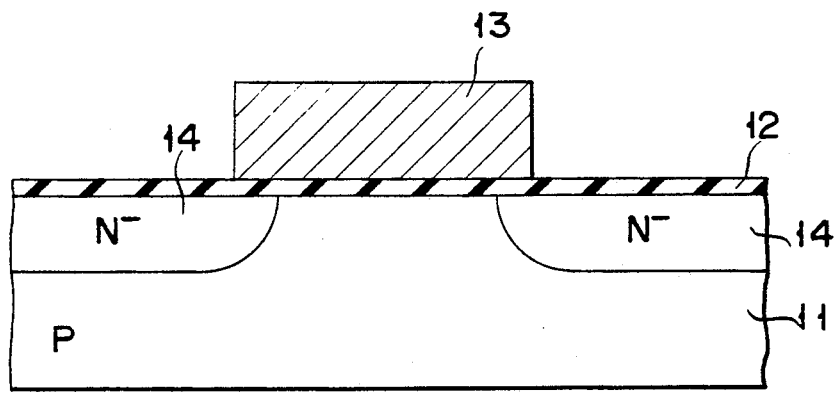
F I G. 2A
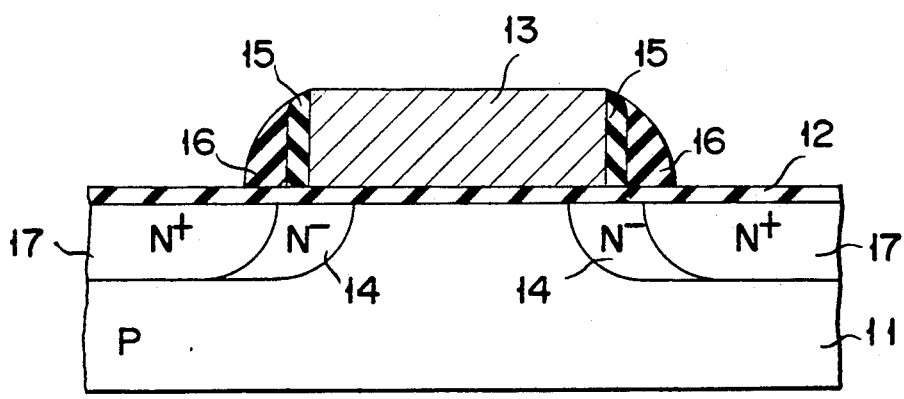
F I G. 2B

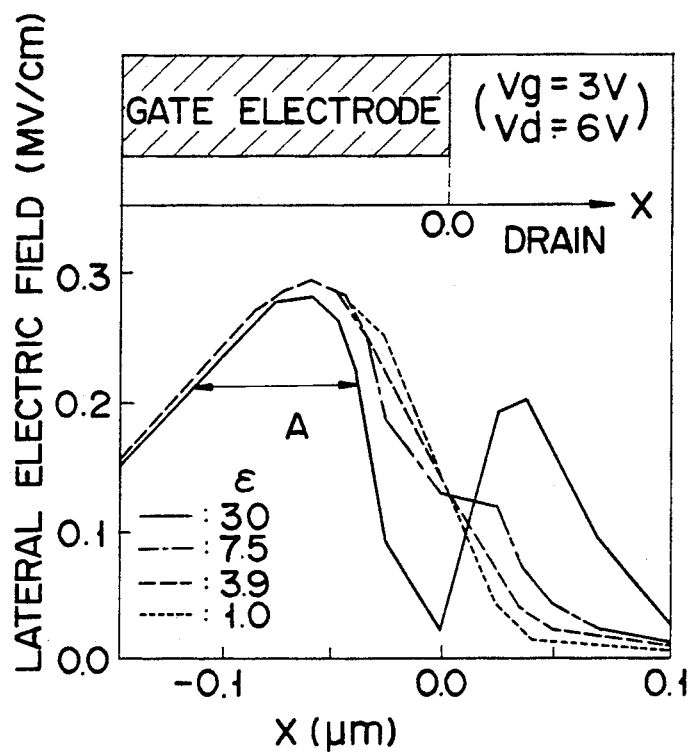
F I G. 3
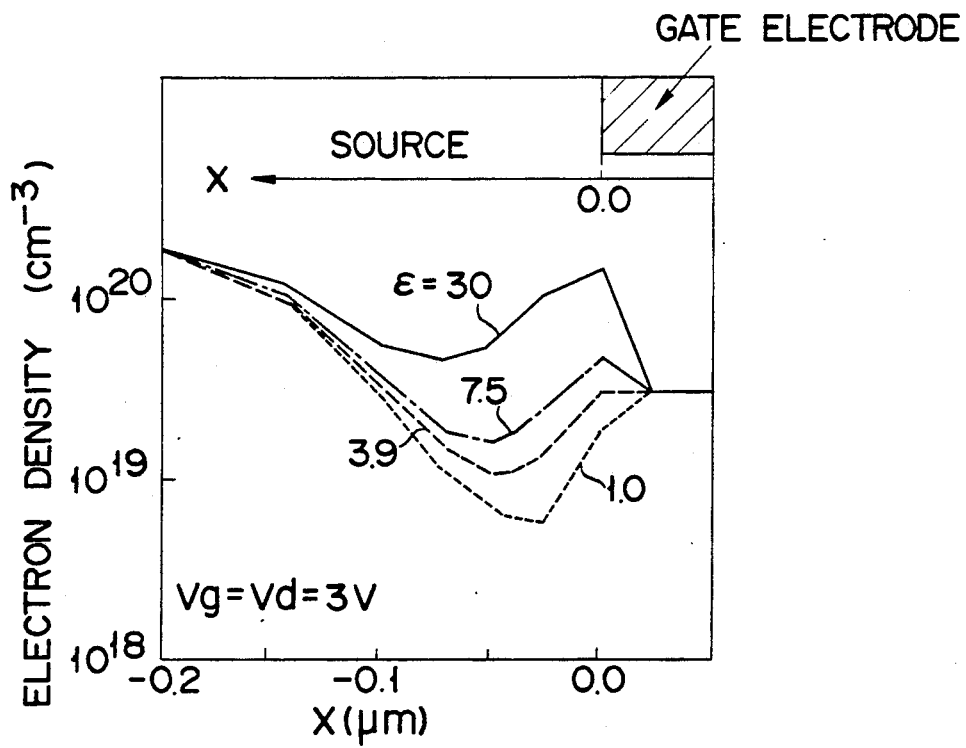
F I G. 4

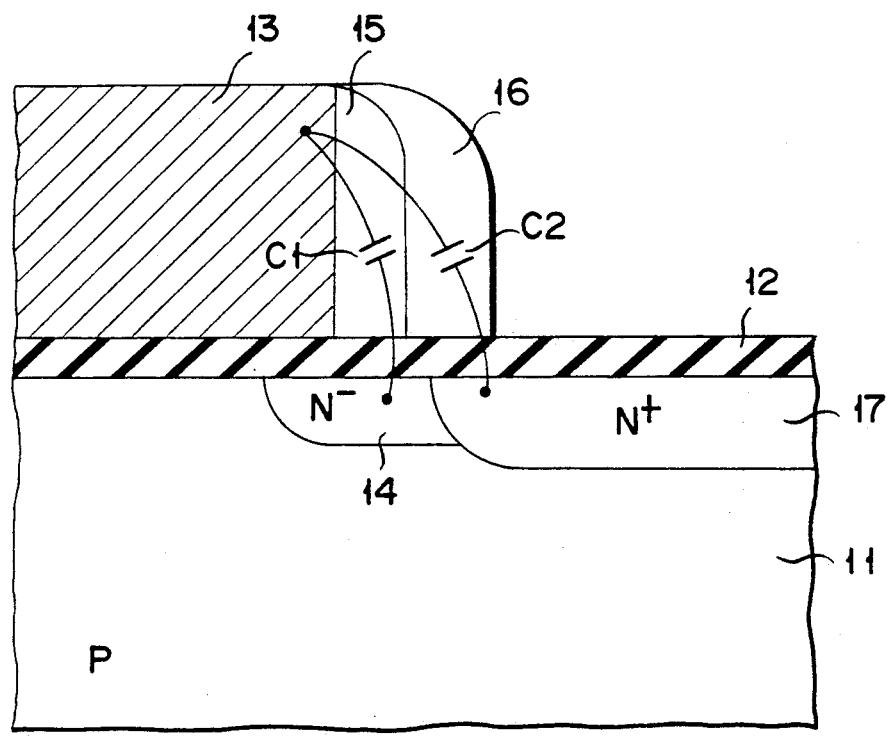
F I G. 5

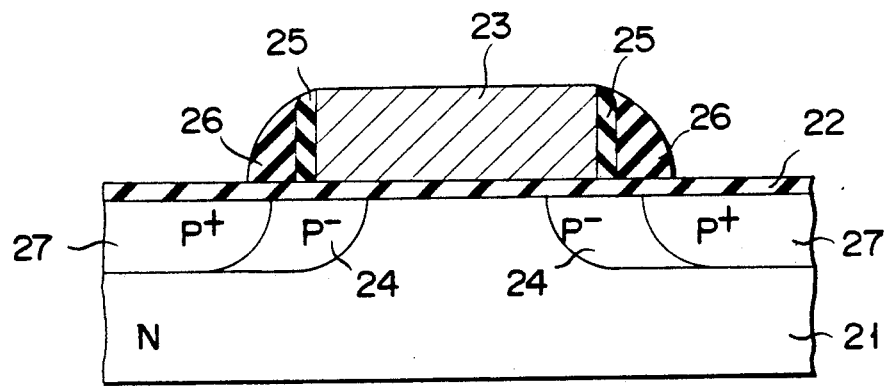
F I G. 6
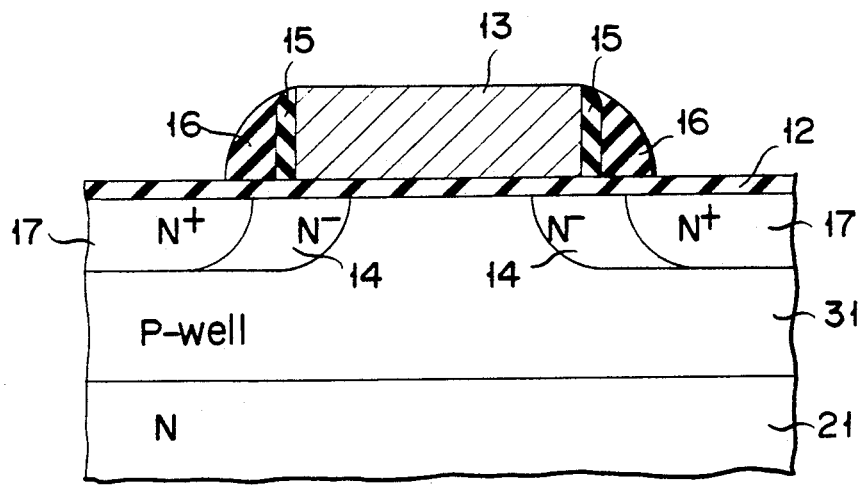
F I G. 7
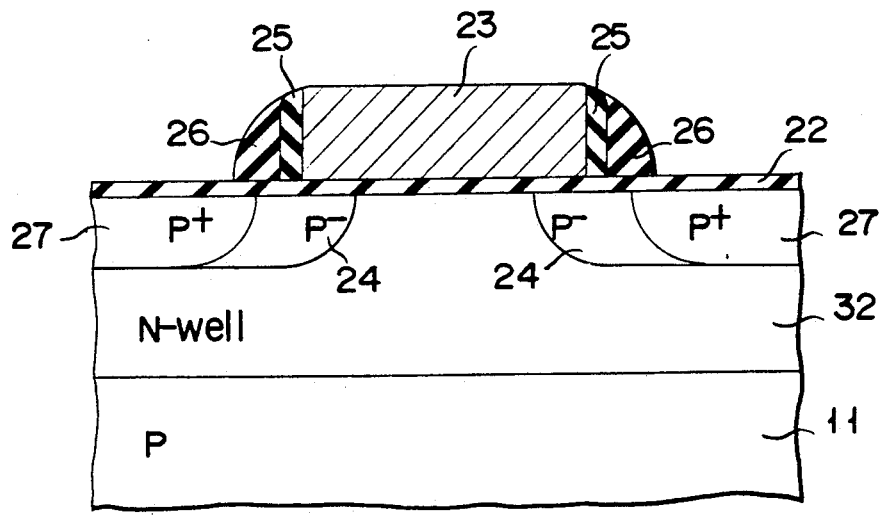
F I G. 8

MOS SEMICONDUCTOR DEVICE HAVING LDD STRUCTURE

BACKGROUND OF THE INVENTION

1. Field of the Invention

The present invention relates to a MOS FET (MOS type field effect transistor) having an LDD (lightly doped drain) structure.

2. Description of the Related Art

It is known to the art that an LDD structure is effective for preventing a change of characteristics caused by hot carriers in an n-channel type MOS FET.

FIG. 1 is a cross sectional view showing the construction of a conventional n-channel type MOS FET utilizing an LDD structure. As shown in the drawing, a gate electrode 3 is formed on a p-type silicon substrate 1 with a gate oxide film 2 having a thickness of, for example, 150 Å interposed therebetween. Source and drain regions are formed apart from each other on the substrate with the gate electrode 3 positioned therebetween. Each of these source and drain regions comprises an $n^-$-type region 4 containing a low concentration of an n-type impurity and an $n^+$-type region 6 containing a high concentration of an n-type impurity. The $n^-$-type region 4, which is positioned on the substrate surface, is formed by means of an ion implantation using the gate electrode 3 as a mask. On the other hand, the $n^+$-type region 6 is formed by an ion implantation using as a mask the gate electrode 3 and an oxide film 5 covering the side surface of the electrode 3.

In the LDD structure shown in FIG. 1, the $n^-$-type region 4 on the side of the drain region serves to moderate the peak intensity of the electric field in the drain depletion layer even if a high voltage is applied to the drain side, as described in S. Ogura et al., IEEE Trans. Electron Devices, "Design and characteristics of the lightly doped drain-source (LDD) insulated gate field effect transistor" ED-27, P.1359 (1980). As a result, an impact ionization of hot carriers in the vicinity of the drain region is suppressed so as to decrease the generation of new carriers and, thus, to achieve a high reliability even under application of a high voltage.

It should also be noted that the oxide film 5 left unremoved on the side wall of the gate electrode 3 serves to isolate the source and drain regions from each other, making it possible to suppress the gate parasitic capacitance, as described in H. Ishiuchi et al., IEEE Trans. Electron Devices, "Measurement of intrinsic capacitance of lightly doped drain (LDD) MOSFET's" ED-32, P.2238 (1985).

However, the depletion layer formed within the $n^-$-type region 4 is greater than that formed in the source-drain region of the ordinary structure because the impurity concentration of the region 4 is lower than that of the region of the ordinary structure. The large depletion layer noted above brings about a parasitic drain resistance, with the result that the drain current ID is made lower than that of the region of the ordinary structure even at the initial stage of operation. It follows that the conventional LDD structure shown in FIG. 1 is not satisfactory in the driving capability.

SUMMARY OF THE INVENTION

An object of the present invention is to provide a MOS type semiconductor device having a high driving capability and a high reliability.

According to the present invention, there is provided a MOS type semiconductor device, comprising a first insulating film formed to cover a surface of a semiconductor substrate; a gate electrode selectively formed on said first insulating film; source and drain regions of a double diffusion structure consisting of an impurity diffusion region of a relatively low impurity concentration formed apart from the gate electrode in the surface region of the semiconductor substrate and positioned below the side wall region of the gate electrode, and an impurity diffusion region of a relatively high impurity concentration formed in the surface region of the semiconductor substrate and positioned outside the gate electrode; a first material layer having a first dielectric constant and formed as a side wall of the gate electrode on the impurity diffusion region of the relatively low impurity concentration; and a second material layer having a second dielectric constant small than the first dielectric constant and formed as a side wall of the gate electrode to cover the first material layer, said second material layer being positioned to cover the boundary region between the impurity diffusion regions of the low and high impurity concentrations.

In the particular construction of the present invention described above, the side wall of the gate electrode consisting of the first and second material layers permits moderating the gate fringing electric field. As a result, the drain current is moderated so as to suppress the formation of a parasitic drain resistance within the region of the LDD structure. In addition, it is possible to suppress the gate parasitic capacitance because the side wall of the gate electrode in contact with the impurity diffusion region of the relatively high impurity concentration formed in the surface region of the substrate is formed of an insulating film having a small dielectric constant.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B are cross sectional views collectively showing the steps for manufacturing a MOS transistor of an LDD structure according to one embodiment of the present invention;

FIG. 3 is a graph showing the relationship between the electric field intensity and the lateral distance of the substrate;

FIG. 4 is a graph showing the relationship between the electron density and the lateral distance of the substrate;

FIG. 5 is a cross sectional view showing in a magnified fashion a part of FIG. 2B;

FIG. 6 is a cross sectional view showing the construction of a MOS transistor of an LDD structure according to another embodiment of the present invention; and FIGS. 7 and 8 are cross sectional views each showing the construction of a MOS transistor of an LDD structure according to a modification of the present invention.

DETAILED DESCRIPTION OF THE PREFERRED EMBODIMENTS

Figure 1:
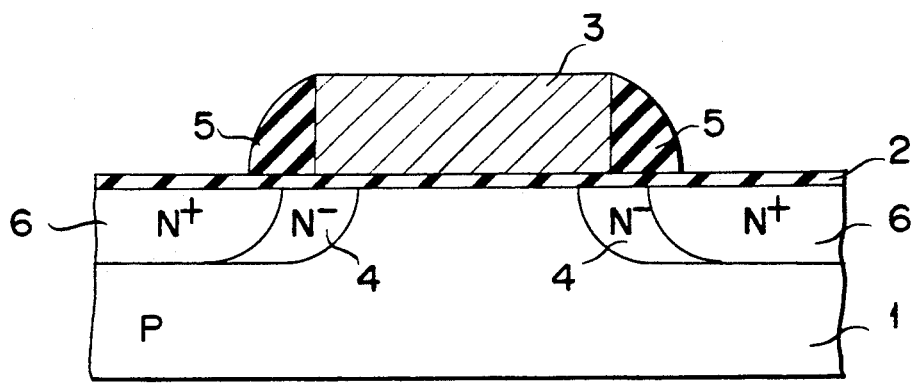
FIG. 1 is a cross sectional view showing the construction of a conventional MOS transistor having an LDD structure.

FIGS. 2A and 2B are cross sectional views collectively showing the steps for manufacturing a MOS transistor of an LDD structure according to one embodiment of the present invention. In the first step, a gate oxide film 12 having a thickness of 100 Å is formed on the surface of a p-type silicon substrate 11 by thermal oxidation of the substrate 11, as shown in FIG. 2A. Then, a polysilicon layer is deposited on the oxide film 12 by means of, for example, CVD (chemical vapor deposition) method, followed by patterning the polysilicon layer so as to form a gate electrode 13. After formation of the gate electrode 13, phosphorus is introduced into the substrate surface region by means of ion implantation at a dose of, for example, $5 \times 10^{13}$ cm$^{-2}$ using the gate electrode as a mask so as to form an n$^-$-type region 14 having a low concentration of the n-type impurity, i.e., phosphorus.

In the next step, an insulating film having a dielectric constant larger than that of the gate oxide film 12, e.g., a Ta$_2$O$_5$ film 15, is formed by means of, for example, a reduced pressure CVD method, as shown in FIG. 2B. The tantalum oxide film 15 thus formed is subjected to RIE (reactive ion etching) such that the Ta$_2$O$_5$ film 15 is selectively left unremoved to cover the side wall of the gate electrode 13. Further, an insulating film having a dielectric constant smaller than that of the Ta$_2$O$_5$ film, e.g., a SiO$_2$ film 16, is formed in a thickness of, for example, about 1000 Å by means of, for example, CVD method, followed by applying RIE to the silicon dioxide film such that the SiO$_2$ film 16 is selectively left unremoved to cover the Ta$_2$O$_5$ film 15. It follows that a dielectric wall of a two-layer structure consisting of the Ta$_2$O$_5$ film 15 and the SiO$_2$ film 16 is formed to cover the side surface of the gate electrode 13. After formation of the dielectric wall, arsenic is introduced into the substrate surface region by means of ion implantation at a dose of $5 \times 10^{15}$ cm$^{-5}$ so as to form an n$^+$-type region 17 containing a high concentration of the n-type impurity, i.e., arsenic. In the ion implantation step, the gate electrode 13 as well as the Ta$_2$O$_5$ film 15 and the SiO$_2$ film 16 covering the side surface of the gate electrode are used as a mask. In this case, the ion implantation should be carried out such that the n$^+$-type region 17 does not extend in the lateral direction to reach the region below the Ta$_2$O$_5$ film 15 having a large dielectric constant.

Incidentally, it is also possible to form the side wall structure of the gate electrode after formation of another oxide film on the substrate 11. To be more specific, the surface of the substrate 11 after formation of the n$^-$-type region 14 may be thermally oxidized to form said "another oxide film", followed by forming the side wall structure of the gate electrode.

In the embodiment described above, the side wall structure of the gate electrode comprises the Ta$_2$O$_5$ film 15, i.e., an insulating film having a large dielectric constant and, thus, exhibiting a high electric flux density, which is in direct contact with the gate electrode. Thus, the electric field intensity is very high on the side surface of the gate electrode. The side wall structure noted above also comprises the SiO$_2$ film 16 covering the outer surface of the Ta$_2$O$_5$ film 15. It should be noted that the dielectric constant of the SiO$_2$ film is smaller than that of the Ta$_2$O$_5$ film and, thus, the electric flux density in the outer region of the side wall structure is lower than in the inner region. It follows that the embodiment shown in FIGS. 2A and 2B permits moderating the gate fringing electric field.

FIG. 3 is a graph showing the relationship between the intensity of electric field and the lateral distance X of the substrate covering the case where the specific dielectric constant $\epsilon$ is increased from 1 to 30 under the bias condition which permits the hot carrier generation in the greatest amount, i.e., $Vg = \frac{1}{2}Vd = 3V$ (where Vg denotes the gate voltage, and Vd denotes the drain voltage). The point right under the side surface of the gate electrode is plotted as the origin (0, 0) in the graph of FIG. 3. As clearly seen from the graph, the maximum intensity of the electric field on the surface of the silicon substrate is decreased with increase in the specific dielectric constant $\epsilon$. Also, the width of the high intensity region of the electric field, which is denoted by an arrow A, is diminished with increase in the specific dielectric constant $\epsilon$. In other words, the hot carrier generation is decreased with increase in the specific dielectric constant $\epsilon$ in the side wall structure of the gate electrode so as to moderate the drain electric field. It should also be noted that the gate oxide film 12 on the surface of the silicon substrate 11 unavoidably exhibits a large energy gap, with the result that it is possible to suppress the injection probability of hot carriers into the side wall structure of the gate electrode.

On the other hand, FIG. 4 shows the relationship between the electron density and the lateral distance X of the substrate under the bias condition of $Vg = Vd = 3V$. It should be noted in conjunction with the graph of FIG. 4 that the electric field intensity on the side surface of the gate electrode 13 is increased with increase in the specific dielectric constant $\epsilon$ from 1 to 30 in the side wall structure of the gate electrode, as pointed out above in conjunction with FIG. 3. The increase of the electric field intensity in the side surface of the gate electrode causes the electric field intensity on the substrate surface in the n$^-$-type region 14 to be increased, with the result that the electron density is increased in the n$^-$-type region 14. In other words, the electron density in the n$^-$-type region 14 is increased with increase in the specific dielectric constant $\epsilon$ so as to diminish the depletion layer formed in the n$^-$-type region 14. It follows that it is possible to suppress the parasitic resistance in the n$^-$-type region 14, which is inherent in the LDD structure.

It should also be noted is that parasitic capacitances C$_1$ and C$_2$ are formed by the gate fringing electric field between the n-type regions, i.e., n$^-$-region 14 and n$^+$-type region, and the side surface of the gate electrode, as shown in FIG. 5 which corresponds to a part of FIG. 2B. What should be noted is that the SiO$_2$ film 16, i.e., an insulating film having a low dielectric constant, is positioned above the n$^+$-type region 17 so as to suppress the parasitic capacitance C$_2$ between the side surface of the gate electrode and the n$^+$-type region 17. This is effective for improving the performance of the MOS transistor of the LDD structure.

In the embodiment described above, the side wall structure of the gate electrode 13 consists of the Ta$_2$O$_5$ film 15 and the SiO$_2$ film 16 having a dielectric constant smaller than that of the Ta$_2$O$_5$ film 15. However, it is also possible to use a PZT (lead zirconate titanate) film having a large dielectric constant in place of the Ta$_2$O$_5$ film 15. Likewise, it is possible to use a polytetrafluoro ethylene film having a low dielectric constant in place of the SiO$_2$ film 16. Further, a silicon nitride film may be used in place of the Ta$_2$O$_5$ film 15, with substantially the same effect.

The embodiment described above is directed to an n-channel type MOS transistor. However, it is also possible to apply the technical idea of the present invention to a p-channel type MOS transistor, as shown in FIG. 6, with substantially the same effect. In the embodiment shown in FIG. 6, a gate oxide film 22 is formed on an n-type silicon substrate 21. Further, a gate electrode 23 consisting of polysilicon is selectively formed on the gate oxide film 22. A p$^-$-type region 24 having a relatively low impurity concentration is formed below the oxide film 22 such that the region 24 is positioned under the side surface region of the gate electrode 23. Also, a p$^+$-type region 27 having a relatively high impurity concentration is formed in a manner to cover the p$^-$-type region 24. These p$^-$-type region 24 and the p$^+$-type region 27 collectively form source and drain regions of a double diffusion structure. It should be noted that an insulating film, e.g., a Ta$_2$O$_5$ film 25, having a dielectric constant larger than that of the gate oxide film 22 is formed to cover the side surface of the gate electrode. As seen from the drawing, the film 25 is positioned above the p$^-$-type region 24. Further, a SiO$_2$ film 26 having a dielectric constant smaller than that of the Ta$_2$O$_5$ film 25 is formed to cover the Ta$_2$O$_5$ film. The film 26 is positioned above the boundary between the p$^-$-type region 24 and the p$^+$-type region 27. In other words, the p$^+$-type region 27 is formed not to extend laterally to reach a region below the Ta$_2$O$_5$ film 25 having a large dielectric constant, as in the embodiment shown in FIG. 2B. These Ta$_2$O$_5$ film 25 and SiO$_2$ film 26 collectively form a side wall structure of the gate electrode.

Each of FIGS. 7 and 8 shows a modification of the embodiment described above. Specifically, the MOS transistor of the particular construction described above may be formed within a semiconductor region, e.g., a well region 31 or 32, formed within the semiconductor substrate.

As described above in detail, the semiconductor device of the present invention comprises a side wall structure of a gate electrode comprising an insulating film having a large dielectric constant and another insulating film having a small dielectric constant. The insulating film having the large dielectric constant is positioned above a low impurity concentration region formed in the surface region of the substrate. On the other hand, the insulating film having the small dielectric constant is positioned above the boundary region between the low and high impurity concentration regions formed in the surface region of the substrate. The side wall structure of the particular construction permits moderating the drain electric field caused by the gate fringing electric field and also permits suppressing the parasitic drain resistance within the LDD structure. What should also be noted is that, since the insulating film positioned above the high impurity concentration region formed in the substrate has a small dielectric constant, it is possible to suppress the gate parasitic capacitance. It follows that the MOS type semiconductor device of the present invention exhibits a high driving capability and a high reliability.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A MOS type semiconductor device, comprising:
a first insulating film formed to cover a surface of a semiconductor substrate;
a gate electrode selectively formed on said first insulating film;
source and drain regions of a double diffusion structure consisting of a first impurity diffusion region formed in the surface region of the semiconductor substrate and positioned below the side wall region of the gate electrode, and a second impurity diffusion region of an impurity concentration higher than that of the first impurity diffusion region, and formed in the surface region of the semiconductor substrate and positioned so as to substantially not underlie the gate electrode;
a first material layer having a first dielectric constant and positioned adjacent to the side wall of the gate electrode and substantially above the first impurity diffusion region; and
a second material layer having a second dielectric constant less than the first dielectric constant and positioned adjacent to the first material layer, said second material layer being positioned substantially above the boundary region between the first and second impurity diffusion regions.

2. The MOS type semiconductor device according to claim 1, wherein each of the first and second material layers is formed of an insulating material.

3. The MOS type semiconductor device according to claim 1, wherein the second material layer is formed of SiO$_2$, and the first material layer is formed of an insulating material having a specific dielectric constant larger than that of SiO$_2$.

4. The MOS type semiconductor device according to claim 1, wherein the first material layer is formed of Ta$_2$O$_5$ and the second material layer is formed of SiO$_2$.

5. The MOS type semiconductor device according to claim 1, wherein the first material layer is formed of Si$_3$N$_4$ and the second material layer is formed of SiO$_2$.

6. The MOS type semiconductor device according to claim 1, wherein the first material layer is formed of PZT having a large dielectric constant and the second material layer is formed of polytetrafluoro ethylene having a small dielectric constant.

7. The MOS type semiconductor device according to claim 1, wherein the first insulating film is interposed between the first material layer and the semiconductor substrate, positioned at least below the gate electrode, and has a band gap greater than that of the first material layer.

8. The MOS type semiconductor device according to claim 1, wherein the first insulating film is formed of SiO$_2$ and has a thickness greater than the mean free path of the hot carrier in at least the region between the first material layer and the semiconductor substrate.

9. The MOS type semiconductor device having an LDD structure, comprising:
   a first insulating film formed to cover a surface of a silicon substrate of a first conductivity type;
   a gate electrode selectively formed on said first insulating film;
   source and drain regions of a double diffusion structure consisting of a first impurity diffusion region formed in the surface region of the semiconductor substrate and positioned below the side wall region of the gate electrode, said first impurity diffusion region having a second conductivity type, and a second impurity diffusion region of an impurity concentration higher than that of the first impurity diffusion region, and formed in the surface region of the semiconductor substrate in contact with the first impurity diffusion region and positioned so as to substantially not underlie the gate electrode, said second impurity diffusion region having a second conductivity type;
   a first side wall of the gate electrode positioned adjacent to the side surface of the gate electrode, having a first dielectric constant and positioned substantially above the first impurity diffusion region; and
   a second side wall of the gate electrode positioned adjacent to the first side wall of the gate electrode, having a second dielectric constant less than the first dielectric constant, and formed substantially above the boundary region between the first and second impurity diffusion regions.

10. The MOS type semiconductor device according to claim 9, wherein each of the first and second side walls of the gate electrode is formed of an insulating material.

11. The MOS type semiconductor device according to claim 9, wherein the second side wall of the gate electrode is formed of $SiO_2$, and the first side wall of the gate electrode is formed of an insulating material having a specific dielectric constant larger than that of $SiO_2$.

12. The MOS type semiconductor device according to claim 9, wherein the first side wall of the gate electrode is formed of $Ta_2O_5$ and the second side wall of the gate electrode is formed of $SiO_2$.

13. The MOS type semiconductor device according to claim 9, wherein the first material layer is formed of $Si_3N_4$ and the second material layer is formed of $SiO_2$.

14. The MOS type semiconductor device according to claim 9, wherein the first side wall of the gate electrode is formed of PZT having a large dielectric constant and the second side wall of the gate electrode is formed of polytetrafluoro ethylene having a small dielectric constant.

15. The MOS type semiconductor device according to claim 9, wherein the first insulating film is interposed between the first side wall of the gate electrode and the semiconductor substrate, positioned at least below the gate electrode, and has a band gap greater than that of the first side wall of the gate electrode.

16. The MOS type semiconductor device according to claim 9, wherein the first insulating film is formed of $SiO_2$ and has a thickness greater than the mean free path of the hot carrier in at least the region between the first side wall of the gate electrode and the semiconductor substrate.

* * * * *